United States Patent [19]
Enomoto et al.

[11] Patent Number: 5,211,794
[45] Date of Patent: May 18, 1993

[54] WAFER ETCHING APPARATUS

[75] Inventors: Tatsuo Enomoto; Michito Sato, both of Fukushima, Japan; Shigeyoshi Nezu, Selangor, Malaysia

[73] Assignee: Shin-Etsu Handotai Co., Ltd., Tokyo, Japan

[21] Appl. No.: 776,787

[22] Filed: Oct. 16, 1991

[30] Foreign Application Priority Data

Oct. 16, 1990 [JP] Japan .................................. 2-275186

[51] Int. Cl.⁵ ........................ H01L 21/306; B44C 1/22
[52] U.S. Cl. .................................... 156/345; 156/639; 156/662
[58] Field of Search ............... 156/637, 639, 345, 662; 134/25.1, 25.5, 33, 137, 157, 159

[56] References Cited
U.S. PATENT DOCUMENTS 3,964,957 6/1976 Walsh ............................. 156/637 X
4,388,140 6/1983 Nakazato et al. ..................... 56/345

FOREIGN PATENT DOCUMENTS

54-37581 3/1979 Japan .................................. 156/639

Primary Examiner—William A. Powell
Attorney, Agent, or Firm—Lowe, Price, LeBlanc & Becker

[57] ABSTRACT

A wafer etching apparatus for etching wafers provided with an orientation flat, composed of a casing, at least five horizontal, parallel and rotative rollers having annular engagement grooves arranged at regular intervals in the axial direction to receive and support wafers vertically, and a press rod means, wherein the rotative rollers are arranged such that the rollers cooperate to circumscribe the wafers, and that when the orientation flat faces any one of the rollers the rest of the rollers cooperate to hold the wafer so as to prevent the orientation flat from coming in contact with the facing roller.

7 Claims, 7 Drawing Sheets

FIG. 10

WAFER ETCHING APPARATUS

BACKGROUND OF THE INVENTION

The present invention relates to a wafer etching apparatus for holding a plurality of semiconductor wafers and steeping the wafers in an etchant to thereby etch the surfaces of the wafers.

PRIOR ART

A semiconductor wafer which is made into substrates for semiconductor devices is obtained from a single crystal ingot, such as one grown of silicon, by slicing the ingot in a direction normal to the axis of the ingot to thereby yield thin discs, which are then lapped, etched, polished, and given other treatments.

Of these treatments the etching treatment of the semiconductor wafers is conducted by means of an etching apparatus, which is composed of a casing generally shaped like a drum horizontally laid down. Passed across this drum-like casing from one end to the other of the casing are at least two parallel, horizontal main rollers, each main roller having plurality of endless circumferential grooves cut in the surface thereof at regular intervals. A press member having similar endless grooves is also passed across the casing from one end to the other and in parallel to the main rollers. The grooves of the main rollers and the press member are cut at places such that if one wafer is placed in one of the grooves of the press member, there is one groove each on the respective main rollers which can receive the same wafer in a manner such that the wafer stands normal to the axes of the rollers. The main rollers and the press member are rotative about their axes and the main rollers are rotated by means of a drive mechanism.

Putting the wafers in the grooves of the main rollers and the press member in the same manner described above, it is possible to pack the casing with a large number of the wafers all constrained to stand vertically at regular intervals and in parallel with each other. Then, the casing together with the wafers is steeped in an etchant, and the main rollers are driven by the drive mechanism to turn so that all the wafers are caused to turn round in the etchant whereby a uniform etching is facilitated.

PROBLEMS THE INVENTION SEEKS TO SOLVE

Figure 2:
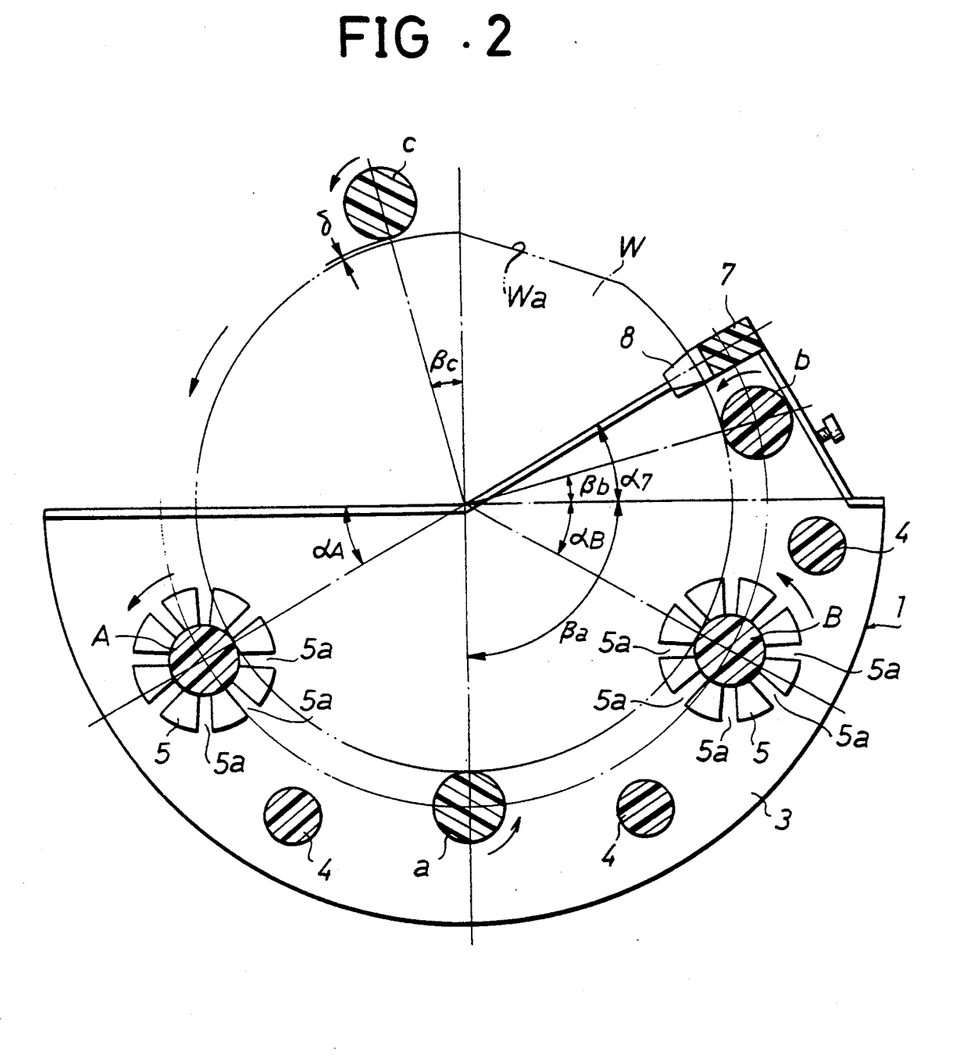
FIG. 2 is an enlarged sectional view of the wafer etching apparatus taken on line II—II FIG. 1.

Generally, a wafer has an orientation flat (hereinafter merely referred to as "OF") at a portion of its circumference for the purpose of indicating the crystal orientation, that is, the direction of the crystallographic axis. With reference to FIG. 2, an OF designated as Wa is shown. When a conventional wafer etching apparatus is used to conduct the etching operation on the semiconductor wafers with OF, a problem occurs.

If a wafer had a complete circular circumference, the wafer would turn smoothly on the main rollers without changing the position of its center. However, with the OF portion in the circumference, a wafer turns irregularly; that is, each time the OF portion is on any of the main rollers, the wafer tilts so that the center of the wafer is displaced for a moment. This sudden irregular movement of the wafer results in a collision of the wafer periphery against the main rollers whereby the wafer periphery is liable to be chipped. Furthermore, such irregular turning of the wafer is liable to result in a lack of uniformity in the etching degree on the wafer surface. These abnormalities impair the quality of the wafer and the yield of semiconductor chips obtained from the wafer is reduced.

SUMMARY OF THE INVENTION

This invention was contrived in view of the foregoing problems, and it is an object of the invention to provide a wafer etching apparatus which enables the wafers with OF packed in the casing to rotate smoothly and without tilting, so that the periphery of the wafers is scarcely damaged and the surfaces of the wafers are uniformly etched.

MEANS TO SOLVE THE PROBLEMS

In order to attain the objects of the invention, a wafer etching apparatus was newly designed. According to the present design, the improved wafer etching apparatus is, like the conventional one, composed of a casing generally shaped like a horizontally laid drum, at least two horizontal, parallel and rotative rollers having annular engagement grooves arranged at regular intervals in the axial direction to receive and support wafers vertically, and a press rod means extending in parallel with the rollers, having grooves arranged at the same intervals as the rollers to receive and guide the wafers, and maintaining the wafers in firm contact with the rollers, and a drive means to drive the rollers to rotate about their axes. The improvement made by the present invention consists in that the rotative rollers are at least five in number and arranged such that the rollers cooperate to substantially circumscribe the wafers, that any two of the rollers are apart from each other so much that the orientation flat does not face any two rollers at a time, and that when the orientation flat faces any one of the rollers the rest of the rollers cooperate to hold the wafer so as to prevent the radial movement of the wafer and thus prevent the orientation flat from coming in contact with the facing roller.

Preferably, the rotative rollers are five in number and are arranged such that the rollers cooperate to circumscribe the wafers, and that, when seen in a cross section like FIG. 2, any quadrangle defined by the centers of any four of the five rollers includes the center of the wafer in it.

In an embodiment of the invention, the rotative rollers are five in number and are arranged such that the rollers cooperate to circumscribe the wafers except the highest roller which is positioned slightly apart from the periphery of the wafer and substantially close to the top of the wafer, and that, when seen in a cross section like FIG. 2, any quadrangle defined by the centers of any four rollers including the highest roller includes the center of the wafer in it.

Still more preferably, one of the rollers is at the bottom of the wafer and two of the rollers are positioned such that the centers of them form an approximately right triangle with the center of the highest roller.

Also it is preferred that the two rollers whose centers form an approximately right triangle with the center of the highest roller are provided with groups of radially extending vanes to define the annular engagement grooves between them, the vanes being separated from the circumferentially neighboring ones by radial slits to provide passages for the neighboring engagement grooves to communicate with each other in the axial direction of the rollers.

In order to improve the uniform etching of the wafers, the present invention also proposes to include a bubbling device for ejecting air bubbles toward the casing.

EFFECTS OF THE INVENTION

According to the invention, there are provided at least five rotative rollers arranged such that when the orientation flat faces any one of the rollers the rest of the rollers cooperate to hold the wafer so as to prevent the radial movement of the wafer and thus prevent the orientation flat from coming in contact with the facing roller; in particular, when the orientation flat faces any one of the rollers there are always two rollers prevent the wafer from moving toward the said facing roller; therefore, the center of each wafer is always stationary, the rotation of the wafer is smooth, and no radial movement of the wafer takes place so that the periphery portion of the wafer does not get damaged and an uniform etching operation is applied to the surface of the wafer.

Next, an embodiment of the wafer basket of the invention will be described in detail with reference to the attached drawings.

DETAILED DESCRIPTION OF THE INVENTION

Figure 1:
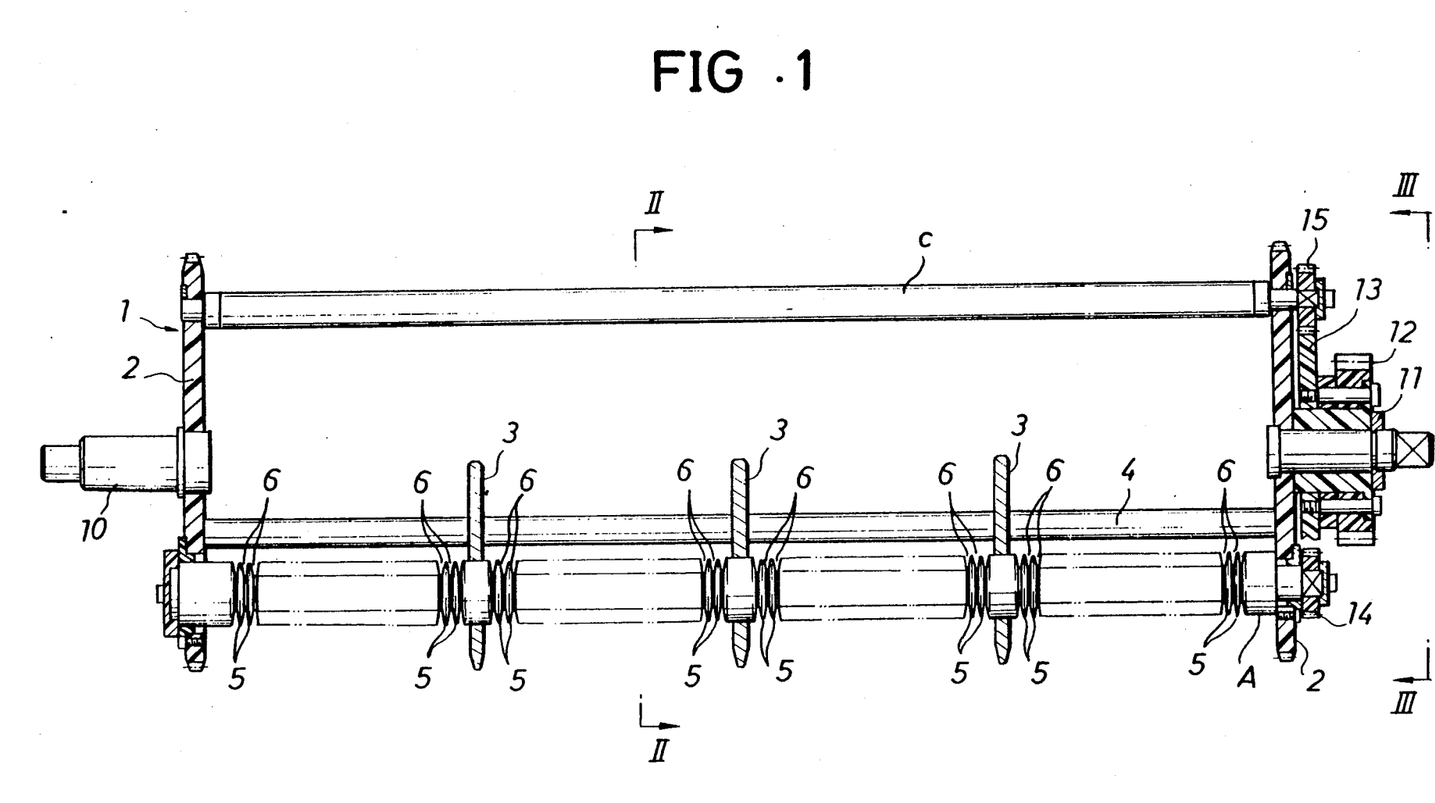
FIG. 1 is a longitudinal view partly in section of a casing of a wafer etching apparatus according to the invention.

With reference to FIG. 1, the reference numeral 1 designates a casing made of polyvinyl chloride (PVC), which is an integral frame body consisting of a pair of vertical side plates 2 which are in the shape of discs, three support plates 3 arranged between and in parallel with the side plates 2, and three horizontal reinforcing bars 4, which are round rods and connect the side plates 2 and the support plates 3 together. In this embodiment the support plates 3 are in the shape of a sector having a central angle of about 210°.

A pair of parallel main rollers A, B, which penetrate the side plates 2 and the support plates 3 of the casing 1, are horizontally supported by these plates in a manner such that the rollers A, B are freely rotative about their axes. As shown in FIG. 2, the main rollers A, B are below the horizontal plane that includes the centers of the side plates 2. The plane that includes the centers of the side plates 2 and the central axis of the main roller A forms an angle of $\alpha A$ (e.g. 30°) with the said horizontal plane at the center line connecting the centers of the side plates 2, and the plane that includes the said center line and the central axis of the main roller B forms an angle of $\alpha B$ (e.g. 30°) with the said horizontal plane at the said center line. These main rollers A, B are provided with radially extending vanes 5 in the following manner: groups of eight vanes 5 are attached to the surface of the main rollers A, B, each group being fixed annularly along a circumference of the respective main rollers; the groups are axially arranged in a row at regular intervals. The thickness of the vanes 5 is radially converging, as shown in FIG. 1. Between axially neighboring vanes 5 are formed engagement grooves 6 which are of an appropriate size to guide and engage with the periphery of a wafer W (ref. FIG. 2). Incidentally, between circumferentially neighboring vanes 5 are formed radial slits 5a, by way of which the engagement grooves communicate with each other.

Figure 4:
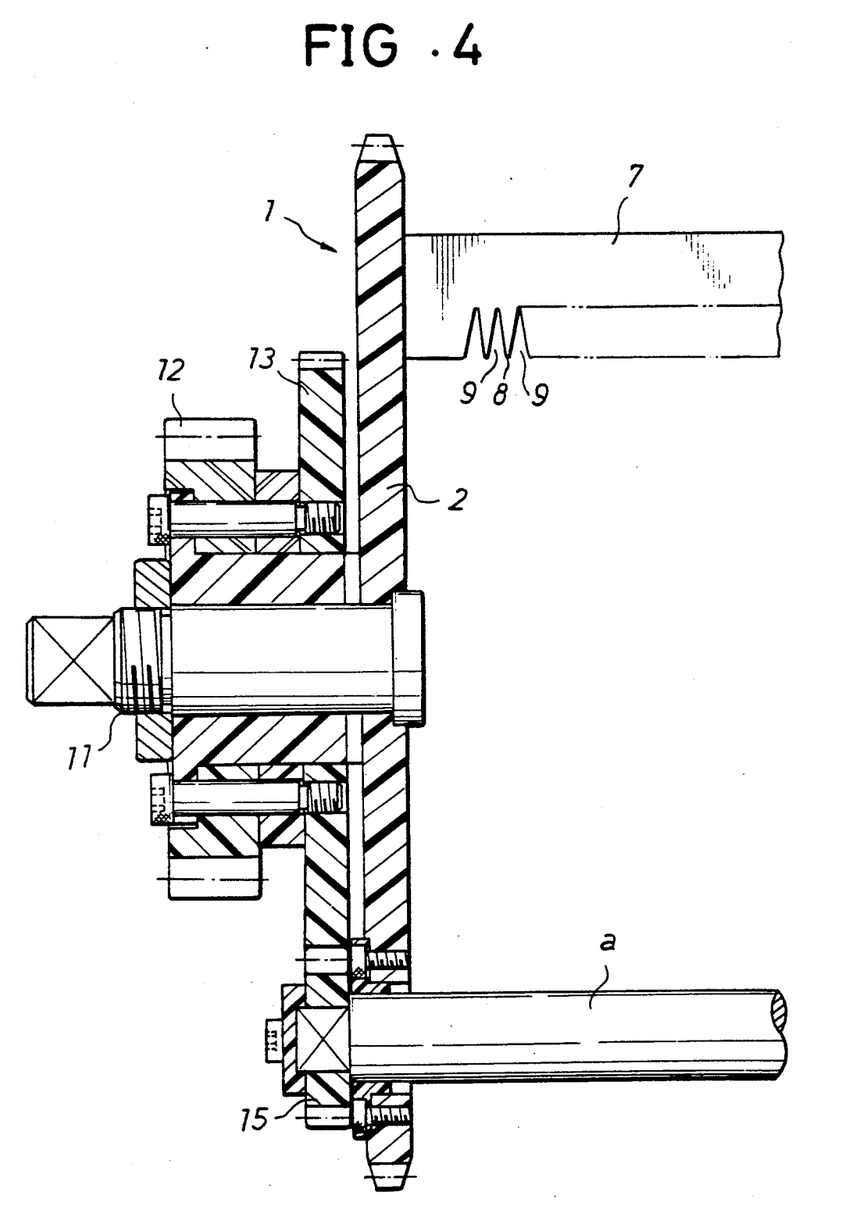
FIG. 4 is a view partly in section of the same apparatus taken on line IV—IV in FIG. 3.

A press member 7, which is a plate made of polyvinyl chloride, is provided between upper parts of the side plates 2 of the casing 1 in a manner such that the press member 7 is in parallel with the main rollers A, B and at a positive elevation angle of $\alpha 7$ (e.g. 30°) viewed from the said center line connecting the centers of the side plates 2 (ref. FIG. 2). As shown in FIG. 4, a plurality of teeth 8 extend inwardly from the press member 7. The number and the interval of the teeth 8 are equal to those of the vanes 5 of each main rod. Formed between each neighboring teeth 8 are engagement grooves 9 which are of an appropriate size to guide and engage with the periphery of a wafer W. Like the vanes 5, the thickness of the teeth 8 is radially converging, as shown in FIG. 4. The number and the pitch of the engagement grooves 9 are equal to those of the engagement grooves 6 of each main rollers A, B.

In the present embodiment, as shown in FIG. 2, horizontal supplementary rollers a, b and c, made of polyvinyl chloride, are provided in a manner such that the center lines of the supplementary rollers a, b and c and those of the main rollers A, B roughly define a circular cylinder and that a wafer-sized circle is roughly circumscribed by these supplementary rollers a, b, c as well as the main rollers A, B. In particular, around this imaginary wafer-sized circle, the supplementary roller a is arranged between the main rollers A, B, the supplementary roller b between the main roller B and the press member 7, and the supplementary roller c between the press member 7 and the main roller B. The supplementary rollers a, b, c are all in parallel with the main rollers A, B and are freely rotative about their respective axes. The supplementary rollers b and c are above the horizontal plane that passes the center line connecting the centers of the side plates 2, 2, and the supplementary roller a is below it. When seen at the cross section II—II from the direction of arrows III, that is, in FIG. 2, the center line of the supplementary roller a lies in the vertical plane that passes the centers of the side plates 2, 2; thus, the angle $\beta a$ in FIG. 2 is 90°. The center line of the supplementary roller b lies at a positive elevation angle of $\beta b$ (e.g. 15°) viewed from the center line connecting the centers of the side plates 2. The center line of the supplementary roller c lies in a plane which forms an angle of $\beta c$ (e.g. 15°) with the vertical plane passing the centers of the side plates 2, 2.

Figure 3:
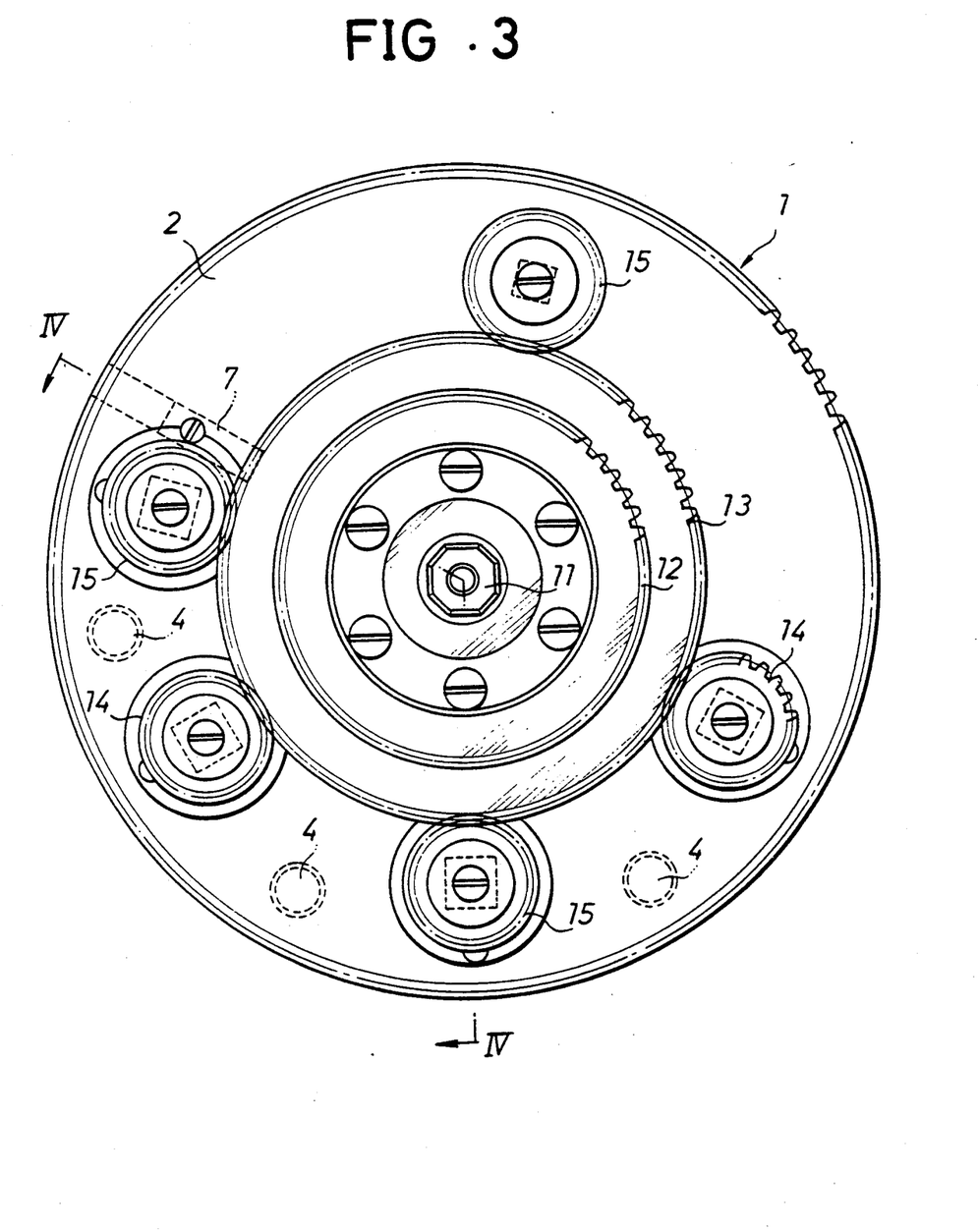
FIG. 3 is a side view of the same apparatus of FIG. 2 as seen in the direction of the arrows III, III in FIG. 6.

As shown in FIG. 1, horizontal short shafts 10, 11 are fixed in the holes made in the respective centers of the side plates 2, 2 of the casing 1, and a drive gear 12 and a center gear 13 are provided about the shaft 11 in a manner such that these gears are locked to each other by means of bolts but are freely rotative about the shaft 11. As shown in FIG. 3, the center gear 13 meshes with roller gears 14, 14 fixed at the same-side ends of the main rollers A, B, and also with the roller gears 15, 15, 15 fixed at the same-side ends of the supplementary rollers a, b, c. The drive gear 12 is in mesh with the gear fixed on an output shaft of a drive source, not shown, such as a motor. Incidentally, the drive gear 12, the center gear 13 and the roller gears 14, 14, 15, 15, 15, are all made of polyvinyl chloride.

Next, the etching operation of the wafer etching apparatus of the invention will be described.

Firstly, a large number of wafers W having an OF portion Wa are set in the casing 1. In this embodiment one hundred wafers can be etched at a time. Prior to setting the wafers, the supplementary roller c is detached from the casing 1 by removing a setting jig, not shown, from the side plates 2, 2 of the casing 1. Then, it is possible to set the wafers W in the casing 1. Each wafer W is guided in a seat which consists of a set of corresponding engagement grooves 6, 6, 9 of the main rollers A, B and the press member 7, and, thereby the periphery of the wafer W engages with these engagement grooves and the wafer W is steadied and constrained to stand vertically. Thus, a large number of wafers W are set in the casing 1, wherein the wafers W are spaced at regular intervals and capable of turning round in the seat.

The supplementary roller c is restored to the original position and held there by means of the setting jig. Now that the wafers W are captured in the casing 1, as shown in FIG. 2, each wafer W is supported at four points, respectively, by the main rollers A, B and the supplementary rollers a, b, while the supplementary roller c is located at a position such that the distance between the closest points of the supplementary roller c and the periphery of the wafer W does not become less than a predetermined small value $\delta$.

In this embodiment, the supplementary roller c is simply detachable from the one position of the side plates 2, 2 by virtue of the setting jig, but it is also possible to design such that the supplementary roller c is circumferentially slidable toward the supplementary roller b along a pair of arcuate guides made in the side plates 2, 2. Also, in place of the sectorial support plates 3, it is possible to use circular ones having the same diameter as the side plates 2.

Figure 5:
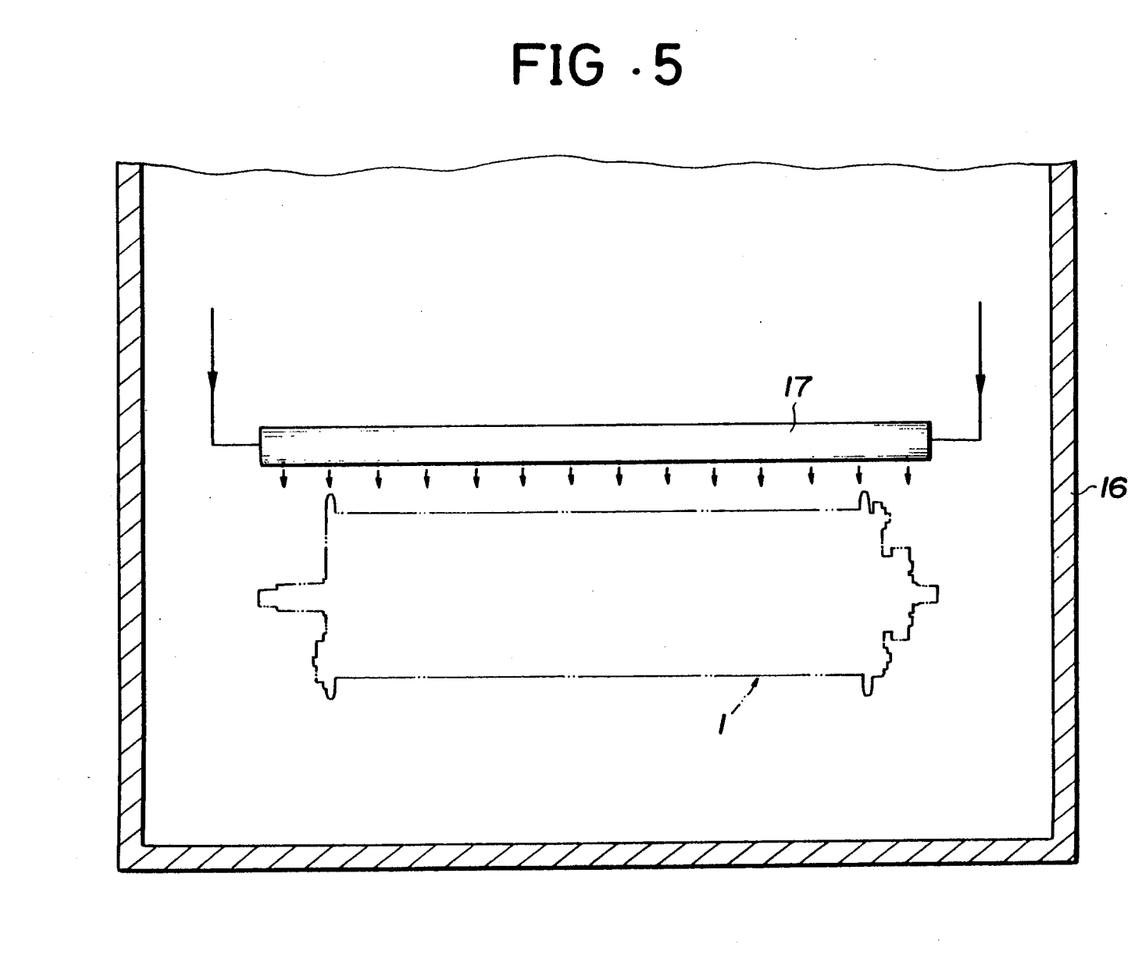
FIG. 5 is a schematical plan view of the same apparatus.

The case 1 holding the numerous wafers W is submerged in an etchant contained in a bath 16, shown in FIG. 5, and when all the wafers W are steeped in the etchant, the drive gear 12 provided at one side of the casing 1 is given a rotational torque from a drive source, not shown, and the drive gear 12 together with the center gear 13 is turned at a predetermined velocity in the clockwise direction, as seen in FIG. 2. The rotational torque of the drive gear 12 and the center gear 13 is transmitted to the main rollers A, B and the supplementary rollers a, b, c by means of the roller gears 14, 14, 15, 15, 15, respectively; then these rollers are turned in the counterclockwise direction, as indicated by the arrows in FIG. 2 whereby all the wafers W are caused to turn clockwise, as seen in FIG. 2.

As explained earlier, each wafer W is formed with the OF portion Wa, but the wafer W never tilts and thus the center of the wafer W is always substantially stationary wherever the OF portion Wa may be. The reason for this will be explained with reference to FIGS. 6 through 10. Incidentally, FIGS. 6 through 10 are drawings similar as FIG. 2 and show how the wafers W are supported.

Figure 6:
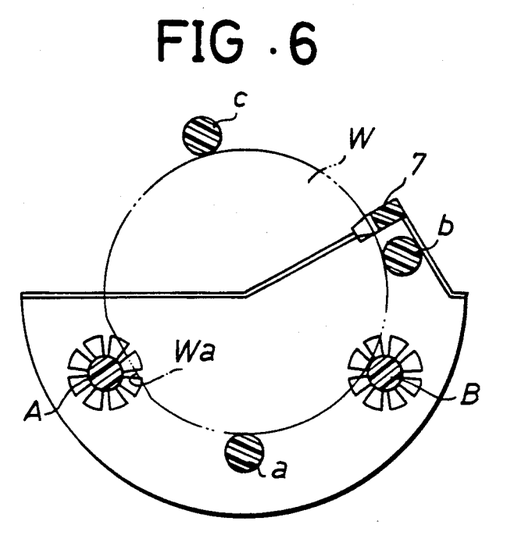
FIG. 6 is a view similar as FIG. 2 showing a manner of supporting a wafer.

As shown in FIG. 6, when the OF portion Wa of the wafer W faces the main roller A, the wafer W is supported by the supplementary rollers a and c so that the center of the wafer W does not move.

Figure 7:
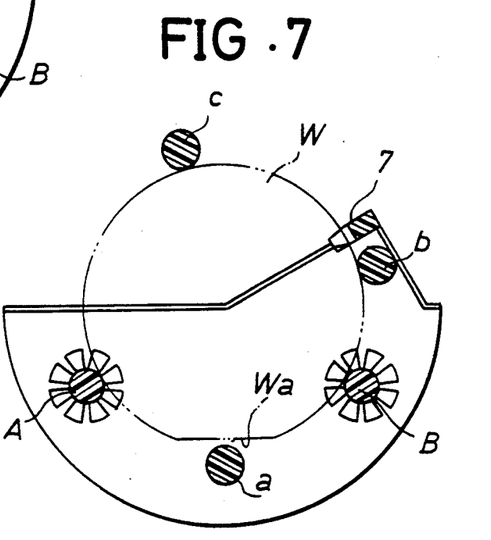
FIG. 7 is a view similar as FIG. 2 showing a manner of supporting a wafer.

When the OF portion Wa of the wafer W faces the supplementary roller a, as shown in FIG. 7, the wafer W is supported by the main rollers A and B so that the center of the wafer W does not move.

Figure 8:
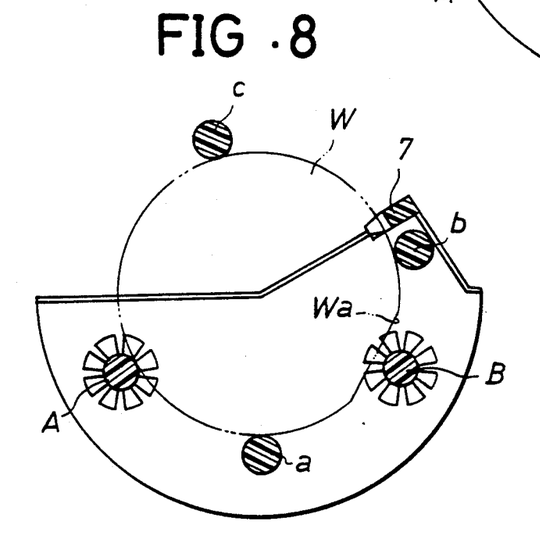
FIG. 8 is a view similar as FIG. 2 showing a manner of supporting a wafer.

The center of the wafer W does not move either, when the OF portion Wa of the wafer W faces the main roller B, as shown in FIG. 8, since the wafer W is supported by the supplementary rollers a and b.

Figure 9:
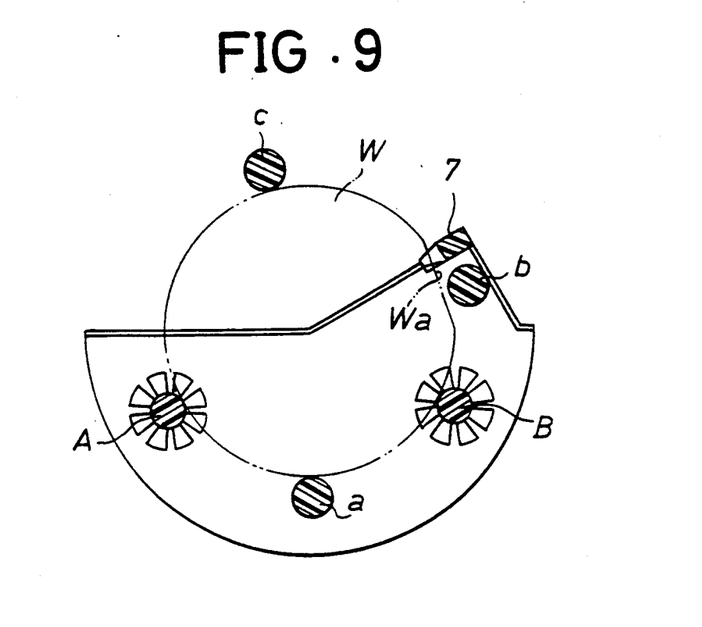
FIG. 9 is a view similar as FIG. 2 showing a manner of supporting a wafer.

Similarly, when the OF portion Wa of the wafer W faces the supplementary roller b, as shown in FIG. 9, the wafer W is supported by the main roller B and the supplementary roller c, so that the wafer W does not tilt.

Figure 10:
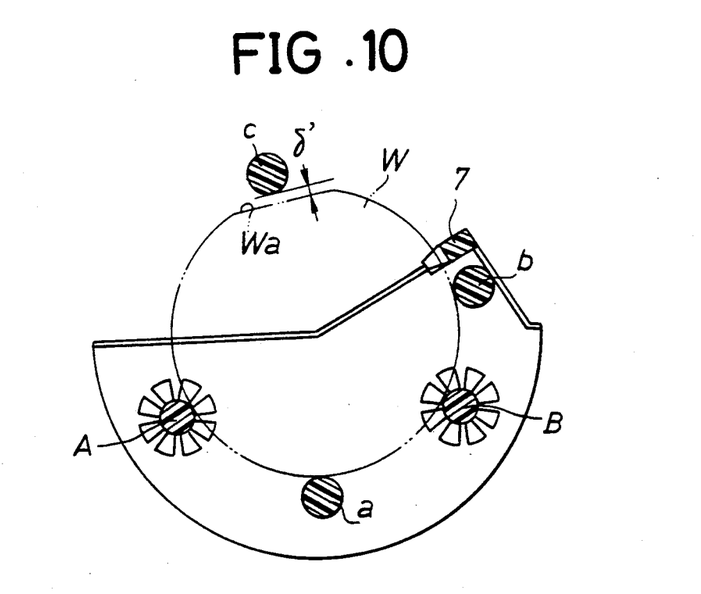
FIG. 10 is a view similar as FIG. 2 showing a manner of supporting a wafer.

Next, when the OF portion Wa of the wafer W faces the supplementary roller c, as shown in FIG. 10, the wafer W is supported by the main rollers A, B and the supplementary rollers a, b so that even when the wafer W is urged to move upward by the convection of the etchant energized by the heat generated by reactions, the upward movement of the wafer W is checked by the supplementary roller c and the wafer W is barely allowed to shift by a clearance $\delta'$ between the OF portion Wa and the supplementary roller c (which is about 1 mm in this embodiment); therefore, the center of the wafer W scarcely moves. If an additional supplementary roller d is provided between the supplementary rollers b and c, the center of the wafer W becomes completely stationary.

As explained above, no matter where the OF portion Wa may face as the wafer W turns, the center of the wafer W is kept virtually stationary, and the wafer W does not shift radially or in any direction, so that the periphery of the wafer W does not collide strongly with the main rollers A, B or the supplementary rollers a, b, c and thus the wafer W is not damaged.

In this embodiment, a bubbling device 17 is installed within the bath 16, and bubbles of clean air are shot out from the bubbling device 17 toward the casing 1 to thereby stir the etchant so that the temperature of the etchant in the bath 16 becomes uniform, which facilitates uniform etching of the surface of each wafer W, and slows the deterioration of the etchant.

Also in the present embodiment of the invention, since the radial slits 5a are provided between circumferentially neighboring vanes 5 (FIG. 2) the area of contact between the wafer W and the vanes 5 is reduced, and the etchant can easily reach the peripheral portions of the wafer W to facilitate uniform etching.

What is claimed is:

1. In a wafer etching apparatus for etching wafers provided with an orientation flat, composed of a casing generally shaped like a horizontally laid drum, at least two horizontal, parallel and rotative rollers having annular engagement grooves arranged at regular intervals in the axial direction to receive and support wafers vertically, and a press rod means extending in parallel with said rollers, having grooves arranged at the same intervals as said rollers to receive and guide the wafers, and maintaining the wafers in firm contact with said rollers, and a drive means to drive said rollers to rotate about their axes, an improvement comprising in that said rotative rollers are at least five in number and arranged such that the rollers cooperate to substantially circumscribe the wafers, that any two of the rollers are apart from each other so much that the orientation flat does not face any two rollers at a time, and that when the orientation flat faces any one of the rollers the rest of the rollers cooperate to hold the wafer so as to prevent the orientation flat from coming in contact with the facing roller.

2. The apparatus as claimed in claim 1 wherein said rotative rollers are five in number and are arranged such that said rollers cooperate to circumscribe the wafers, and that, any quadrangle defined by the centers of any four of the five rollers includes the center of the wafer positioned therein.

3. The apparatus as claimed in claim 1 wherein said rotative rollers are five in number and are arranged such that said rollers cooperate to circumscribe the wafers except a highest one of said rollers which is positioned slightly apart from the periphery of the wafers and substantially close to a top of the wafer, wherein any quadrangle defined by the center of any four rollers including the highest roller includes the center of the wafers positioned therein.

4. The apparatus as claimed in claim 3 wherein another of said rollers is positioned at the bottom of the wafers and two others of the rollers are positioned such that the respective centers form an approximately equilateral triangle with the center of said highest roller.

5. The apparatus as claimed in claim 4 wherein said two others of the rollers include groups of radially extending vanes to define annular engagement grooves therebetween, said vanes being separated from circumferentially neighboring vanes by radial slits to provide passages for neighboring engagement grooves to communicate with each other in the axial direction of the rollers.

6. The apparatus as claimed in claim 1, which further comprises a bubbling device for ejecting air bubbles toward the casing.

7. A wafer etching apparatus comprising:
a cylindrical casing;
first through fifth parallel rollers, each having annular engagement grooves arranged at regular intervals in the axial direction for receiving and supporting wafers, said rollers arranged to substantially circumscribe said wafer whereby a spacing between said rollers is such that an orientation flat of any one of said wafers does not simultaneously face more than one of said rollers and the remaining rollers prevent the orientation flat from coming into contact with said one roller;
a press rod extending parallel with said first and second rollers, said press rod having grooves arranges at the same intervals as said first and second rollers to receive and guide said wafers and to maintain said wafers in contact with said first and second rollers; and
drive means for rotating said rollers about respective axes thereof.

* * * * *